United States Patent
Ladret

(10) Patent No.: US 9,841,465 B2
(45) Date of Patent: Dec. 12, 2017

(54) BATTERY DC IMPEDANCE MEASUREMENT

(71) Applicant: STMicroelectronics International N.V., Amsterdam (NL)

(72) Inventor: Daniel Ladret, Lans-en-Vercors (FR)

(73) Assignee: STMicroelectronics International N.V., Schiphol (NL)

( * ) Notice: Subject to any disclaimer, the term of this patent is extended or adjusted under 35 U.S.C. 154(b) by 511 days.

(21) Appl. No.: 14/328,183

(22) Filed: Jul. 10, 2014

(65) Prior Publication Data
US 2015/0025822 A1     Jan. 22, 2015

(30) Foreign Application Priority Data
Jul. 16, 2013 (EP) .................................. 13368021

(51) Int. Cl.
    *G01R 31/36*     (2006.01)
    *H02J 7/00*     (2006.01)

(52) U.S. Cl.
    CPC ..... *G01R 31/3662* (2013.01); *G01R 31/3675* (2013.01)

(58) Field of Classification Search
    CPC ............ G01R 31/3675; G01R 31/3662; G01R 31/3651; G01R 31/3693; G01R 31/3679
    USPC ........................ 702/57, 60, 63; 320/132, 136
    See application file for complete search history.

(56) References Cited

U.S. PATENT DOCUMENTS

| | | | |
|---|---|---|---|
| 6,114,838 A | 9/2000 | Brink et al. | |
| 7,515,962 B2* | 4/2009 | Lyden | A61N 1/3708 607/29 |
| 2005/0030041 A1 | 2/2005 | Koo | |

OTHER PUBLICATIONS

EPO Search Report and Written Opinion for EP 13368021.5 dated Dec. 10, 2013 (9 pages).

* cited by examiner

*Primary Examiner* — An Do
(74) *Attorney, Agent, or Firm* — Gardere Wynne Sewell LLP

(57) ABSTRACT

The state of charge of a rechargeable battery is determined by calculating the DC impedance of the battery. The impedance is calculated by: performing a two different constant current discharges of the battery at a first and second C-rates, respectively; measuring the voltage and current during the interval of each constant current discharge and calculating the amount of charge extracted from the battery up to a point where the battery voltage drops to a threshold value; calculating the state of charge of the battery; and calculating the DC impedance of the battery as a function of the difference between the battery voltages and discharge currents for the two different discharges.

18 Claims, 2 Drawing Sheets

BATTERY DC IMPEDANCE MEASUREMENT

PRIORITY CLAIM

This application claims priority from European Application for Patent No. 13368021.5 filed Jul. 16, 2013, the disclosure of which is incorporated by reference.

TECHNICAL FIELD

This invention is relevant to methods for measuring the remaining capacity of a rechargeable battery.

BACKGROUND

Many portable electronic devices nowadays comprise rechargeable batteries, and it is useful, if not imperative, that a user of such a device can readily gauge the amount of power remaining in the battery. Knowing the instantaneous remaining battery capacity helps the user to estimate how long the device can be used, for a given duty cycle, before its battery needs to be recharged.

As such, most battery-powered devices are provided with a "fuel gauge" type indicator, which is commonly in the form of "bars" of a graphical user interface (GUI) element, or a series of LED indicators. By displaying the remaining battery charge, the user can judge whether, and how, to continue using the device.

Existing battery charge level indicators comprise circuitry that interfaces with, and which measures certain parameters of the battery, and a computational element that converts the measurements into a useful indication of the remaining battery power.

The two most commonly used display formats are obtained via a State of Charge (SoC) calculation, which yields either a percentage remaining battery charge, and/or the remaining battery capacity, say, in mAh. In addition, it is also possible to measure the instantaneous, or average, power consumption of the device to yield a "time to fully-discharged" indication in units of time. Most portable electronic devices are configured to operate differently depending on the battery charge level. In essence, functionality can be reduced as the remaining battery power drops below certain thresholds, such that the device can be fully-operational (i.e. all features operative) above a first certain threshold level, with functionality being withdrawn as the battery charge level decreases. For example, the screen brightness may be dimmed, WiFi disabled, power-hungry applications disabled, etc. to conserver power as the remaining battery power drops below a series of pre-defined threshold values.

Commonly, therefore, the SoC indicator provides a "100%" reading when the battery is fully charged, and a "0%" reading when the battery charge level drops below a voltage cut-off threshold value. Usefully, the voltage cut-off threshold value does not correspond to 0% remaining battery power, to enable certain device functionality, such as a RAM maintenance voltage, an internal clock, the charging control circuitry, and so on, to persist even when the device notionally switched-off. Such a configuration enables the device to operate correctly when it is connected to a charging power source, even though its functionality may be pared-down until the battery charge level exceeds the voltage cut-off threshold value.

The voltage cut-off threshold value depends on the device manufacturer's preferences, although this voltage is usually around 3.2V to 3.0V.

The remaining battery power calculation is typically performed via: a voltage approach, whereby the battery voltage is measured and compared with a value stored in a lookup table of voltages versus internal battery impedances—the intersection yielding a State of Charge or the remaining capacity. Additionally or alternatively, a "coulomb counter" approach can be used, whereby the remaining capacity calculation is based on measuring the current flowing into, and out of, the battery through a sense resistor. Summing of the "in" and "out" currents can give the total charge that has flown from (e.g. by use), or to (e.g. via charging), the battery and the capacity can be then calculated.

The above two techniques are often used both together in proprietary algorithms to provide the best accuracy.

To obtain a SoC estimation using the above "voltage" approach, the measured battery voltage must be corrected by a voltage drop factor as a result of the battery's internal impedance. The known way to measure the internal impedance of the battery is the so-called "relaxation method" as described in, for example, "Battery management systems—Accurate State-of-charge indication for battery-powered applications", V. Pop and al., Philips Research Book Series, Volume 9, Springer Science—2010 (the disclosure of which is incorporated by reference). This technique involves discharging the battery followed by a rest period, whereby the impedance is calculated by the voltage difference divided by the current load, as set forth in equation 1 below:

$$Z_{int} = (V_{rest} - V_{min})/I_{Load} \qquad \text{(Eq. 1)}$$

Where $Z_{int}$ is the internal battery impedance $V_{rest}$ is the battery voltage after a rest $V_{min}$ is the battery voltage loaded by the current $I_{Load}$ $I_{load}$ is the current load applied to discharge the battery for a while (discharge pulse time depends on the number of points to characterize the battery impedance)

The main problem with the known SoC estimation techniques lies in that the characterization of the impedance of the battery must be performed using specialized laboratory equipment. Because the battery is characterized under laboratory conditions, the characterization might not transpose correctly in actual use, for example when run in an actual application environment. Also, because the battery characterization is carried out independently of system design, the PCB of the hardware and/or the application cannot be taken into account at during characterization, which can lead to inaccuracy in use.

A better approach would be to obtain an impedance reading directly in the application layer, or by the system/device, in use, using real time measurement tools available on the system.

Another drawback of laboratory-based battery characterization subsists in the time it takes to perform the characterization, which can be very long. As described above, the DC impedance can be easily estimated by the by the relaxation method, but this method requires a discharge and a rest time of about 1 hour to be sure that the battery is really in the relaxed phase after stress due to the current load. Therefore, if 100 data points are required, per battery, for the SoC algorithm to work properly, it will take at least 100 hours of characterization time and so the characterization of a battery usually takes around 5 full days to complete.

A need therefore exists for an improved and/or an alternative way to obtain the DC impedance of a rechargeable battery without necessarily having to resort to expensive, and time-consuming, laboratory-based characterization techniques. More specifically, a need exists for a method and/or an apparatus that can obtain the state of charge of a rechargeable battery using battery impedance measurements taken using on-system components.

SUMMARY

In an embodiment, a method of determining state of charge of a rechargeable battery comprises: calculating the DC impedance of the battery by: performing a first constant current discharge of the battery at a first C-rate; measuring the voltage and current during the interval of the first constant current discharge and calculating the amount of charge extracted from the battery up to a point i, whereby the battery voltage drops to a threshold value; calculating the state of charge as being equal to $((Q_{max}-Q_i)/Q_{max}) \times 100$, where $Q_{max}$ is the total charge extracted from the battery, and where $Q_i$ is the amount of charge extracted at the point i, performing a second constant current discharge of the battery at a second C-rate lower than the first C-rate; measuring the voltage and current during the interval of the second constant current discharge and calculating the amount of charge extracted from the battery up to a point i, whereby the battery voltage drops to a threshold value; calculating the state of charge as being equal to $((Q_{max}-Q_i)/Q_{max}) \times 100$, where $Q_{max}$ is the total charge extracted from the battery, and where $Q_i$ is the amount of charge extracted at the point i, and calculating the DC impedance of the battery, for a given state of charge as being: $(Vbat_{second\ C-rate} - Vbat_{first\ C-rate})/(Iload_{first\ C-rate} - Iload_{second\ C-rate})$, where $Vbat_{second\ c-rate}$ and $Vbat_{first\ c-rate}$ are the battery voltages measured at the second C-rate and the first C-rate, respectively and where $Iload_{second\ C-rate}$ and $Iload_{first\ C-rate}$ are the current load when discharging at the second C-rate and the first C-rate, respectively.

Suitably, the amount of charge extracted from the battery can be calculated by recording the current load at intervals through the discharge and by multiplying the current at each interval by the duration of the respective interval. The total charge extracted can be calculated by summing the charge extracted during each interval.

The threshold value is suitably a battery voltage of substantially 3.0V.

The temperature of the battery is suitably measured, and logged, during the first and second constant discharges.

The C-rate is suitably a current used to charge/discharge the battery and may be a part of the nominal capacity current of the battery per hour. For example, a 1000 mAh charge/discharge at 0.8 C rate is charged with a current of 800 mA. In other words, the C-rate is a measure of the rate of charging or discharging the battery expressed as the charge/discharge current divided by the nominal capacity rating of the battery.

The DC impedance of the battery can be obtained relatively easily because it is only necessary to perform two constant current discharges at different C-rates, nominally, a low C-rate and a high C-rate, such as 0.1 C and 0.3 C; or 0.2 C and 0.7 C, for example.

During the constant current discharges, it is preferable that the ambient temperature is in the range of approximately 23-25° C., which may ensure consistency between measurements, and to yield a result that is representative of "normal use". However, the measurements could be performed at different temperatures, and a temperature correction factored in when calculating the impedance of the battery subsequently.

The impedance of the battery is suitably calculated for different SoC values, depending on the number of data points that are required by the SoC calculation software. However, because the method yields a series of DC impedances, i.e. by recording the voltage and current at intervals determined by the user (e.g. at 1-second, or 10-second intervals), the number of impedance values obtained is directly linked to the number of point used during the constant current discharges. As such, the invention yields a large number impedance values in a much shorter time than if a "relaxation" test were to be performed for each data point.

It has been found, experimentally, that a two-discharge impedance calculation is approximately as accurate as the impedance values obtained by a series of "relaxation" tests. However, it will be appreciated that the accuracy of the impedance measurements could potentially be increased by performing more than two constant current discharges, and by comparing the results across more than one pair of values. For example, by performing three discharges, there would be two pairs of values to compare, or if four dischargers were performed, then there would be six pairs of values to compare, and so on.

A temperature correction algorithm can suitably be used to obtain the impedance under other battery temperature measurement conditions.

Suitably, the method also provides the option of obtaining the open-circuit voltage of the battery by using the low C-rate voltage (or high C-rate voltage) and adding the voltage drop due to the internal battery impedance (that has just been calculated). So, the open circuit voltage is given by: $V_{OCV}(SoC, T) = V_{Bat}(SOC,T) + Z_{int}(SOC,T) \times I_{load}$.

BRIEF DESCRIPTION OF THE DRAWINGS

A preferred embodiment of the invention shall now be described, by way of example only, with reference to the accompanying drawings in which.

DETAILED DESCRIPTION OF THE DRAWINGS

Figure 1:
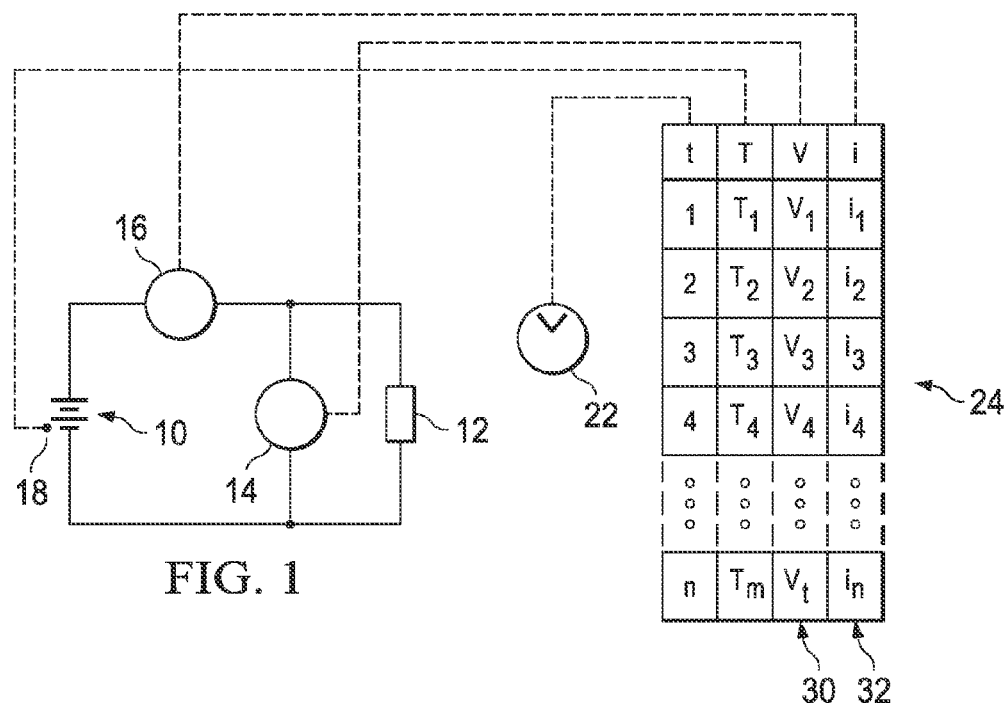
FIG. 1 is a schematic showing a system.

In FIG. 1, a rechargeable battery 10 is discharged through a constant current load 12. During the discharge, the battery voltage is measured by a voltmeter 14 and the discharge current is measured by an ammeter 16. The battery 10 comprises a temperature sensor 18, and the system 20 comprises an internal clock 22.

A first C-rate is selected, and the discharge test begins. At intervals determined by the user (or application), and timed by the system clock 22, voltage, current and temperature readings are taken by the voltmeter 14, ammeter 16 and temperature sensor 18, respectively. These values are recorded in a log 24 comprising a table of time 26, temperature 28, voltage 30 and current 32. The discharge continues until the voltage 30 reaches a threshold cut-off value, typically 3.0V.

Figure 2:
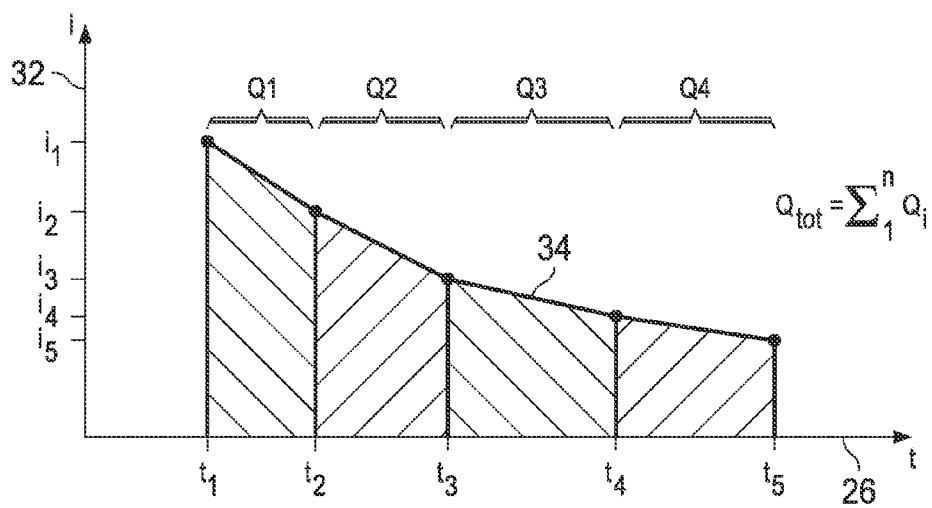
FIG. 2 is a schematic graph of current versus time during a constant current charge test.

The log 24 is then interrogated, and the charge extracted from the battery 10 is calculated, as shown in FIG. 2. Here, the current 32 is plotted as a function of time 26, and the charge is simply the area under the curve 34. The total current extracted can be calculated by summing the area under the curve 34 (Q1+Q2+Q3+ . . . Qn).

Figure 3:
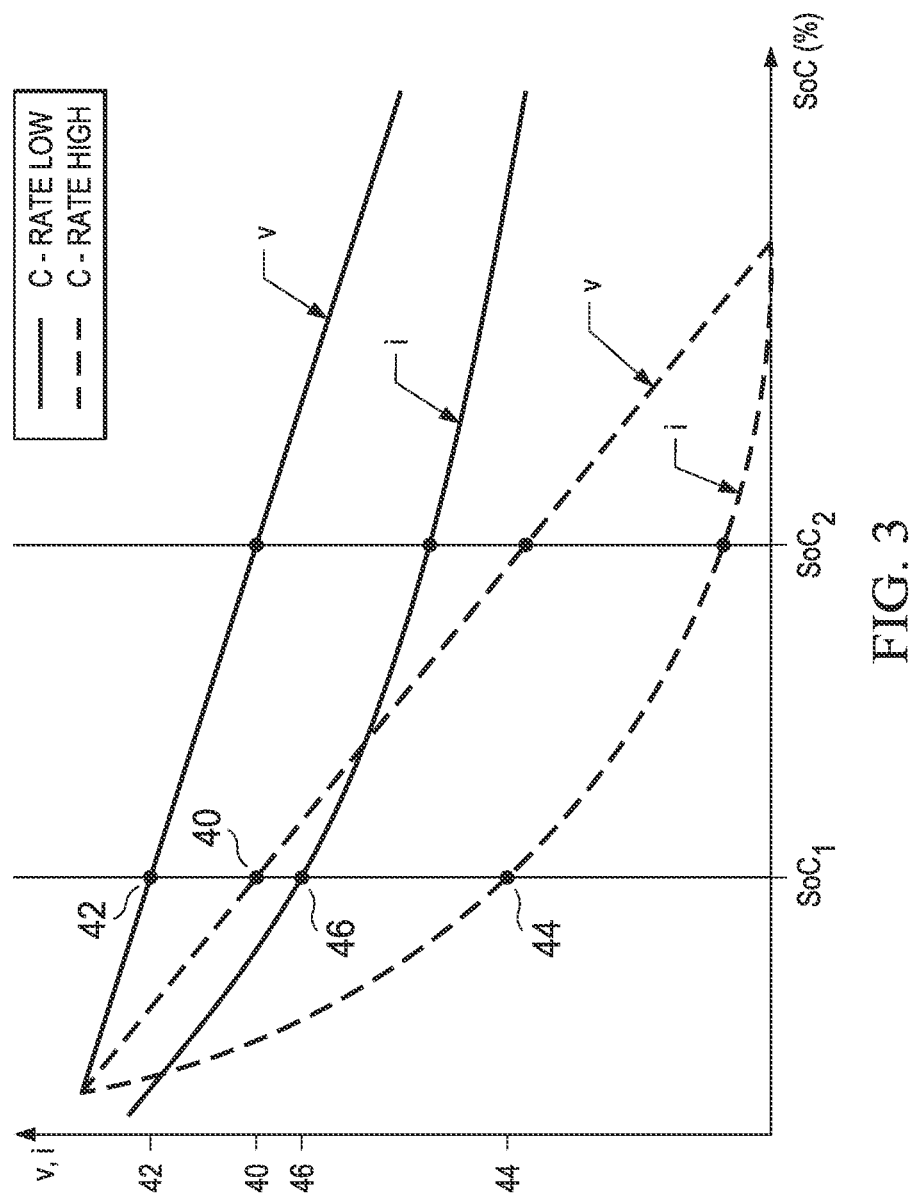
FIG. 3 is a schematic graph of voltage and current as a function of SoC for two C-rates.

Next, the voltage 30 and current 32 is plotted as a function of SoC, as shown in FIG. 3.

The test is then repeated at a second C-rate, following the steps above, and the voltage 30 and current 32 values plotted in the graph of FIG. 3.

Now, for a given SoC value, it is possible to read off a corresponding voltage and current for each of the C-rate discharges, as shown in FIG. 3, whereby the values of $V_{high\ C\text{-}rate}$ 40, $V_{low\ C\text{-}rate}$ 42, $i_{high\ C\text{-}rate}$ 44 and $i_{low\ C\text{-}rate}$ 46 can be seen. These values can then be fed into the equation:

$$Z_{int}(SoC,T) = (Vbat_{low\ C\text{-}rate} - Vbat_{high\ C\text{-}rate}) / (Iload_{high\ C\text{-}rate} - Iload_{low\ C\text{-}rate}) \quad \text{(Eq. 3)}$$

to obtain the impedance of the battery 10 at that particular SoC value. The calculation can be repeated for different SoC values, and of course, for different temperatures.

The resultant impedance values can be stored for later use by a SoC algorithm to correct for variations in the battery 10 impedance at different temperatures, voltages and SoC levels.

Advantageously, the invention may provide a relatively easy way to obtain the impedance of the battery without having to perform detailed and time-consuming impedance characterization tests (e.g. relaxation tests). Experiments have shown that the calculated impedances, obtained by the invention, are reasonably accurate, and that the impedance calculations can be performed on-system, thereby yielding a more realistic "actual use" values, that could, say, a laboratory-based characterization methodology. In addition, the invention may enable system designers or end users to perform impedance characterization for particular batteries, making it possible to characterize multiple batteries for a single application. Owing to the greater granularity of the invention, a greater number of data points can be obtained, compared to the individual relaxation tests, thereby potentially increasing the accuracy of the characterization process whilst also reducing the cost and time of characterization.

What is claimed is:

1. A method of determining a state of charge of a battery comprising steps of:
    calculating a DC impedance of the battery by:
        performing a first constant current discharge of the battery at a first C-rate;
        measuring voltage of the battery and current flowing from the battery during an interval of the first constant current discharge and calculating an amount of charge extracted from the battery up to a point i where the voltage of the battery drops to a first threshold value;
        calculating a first state of charge as being equal to $((Q_{max} - Q_i)/Q_{max}) \times 100$, where $Q_{max}$ is a total amount of charge extracted from the battery, and where $Q_i$ is the amount of charge extracted at the point i;
        performing a second constant current discharge of the battery at a second C-rate lower than the first C-rate;
        measuring the voltage of the battery and current flowing from the battery during an interval of the second constant current discharge and calculating the amount of charge extracted from the battery up to a point j where the voltage of the battery drops to a second threshold value;
        calculating a second state of charge as being equal to $((Q_{max} - Q_j)/Q_{max}) \times 100$, where $Q_{max}$ is the total amount of charge extracted from the battery, and where $Q_j$ is the amount of charge extracted at the point j; and
        calculating the DC impedance of the battery, for a given state of charge as being: $((Vbat_{second\ C\text{-}rate} - Vbat_{first\ C\text{-}rate})/(Iload_{first\ C\text{-}rate} - Iload_{second\ C\text{-}rate})$;

where $Vbat_{second\ C\text{-}rate}$ and $Vbat_{first\ C\text{-}rate}$ are the voltages of the battery measured at the second C-rate and the first C-rate and based upon the first and second states of charge, respectively, and where $Iload_{second\ C\text{-}rate}$ and $Iload_{first\ C\text{-}rate}$ are the current flowing from the battery when discharging at the second C-rate and the first C-rate, respectively.

2. The method of claim 1, wherein the amount of charge extracted from the battery is calculated by recording the current flowing from the battery at intervals throughout the first and second constant current discharges and by multiplying the current flowing from the battery at each interval by a duration of each respective interval.

3. The method of claim 2, further comprising a step of recording in a log the measured currents and times when those currents are measured, and interrogating the log to calculate the amount of charge extracted from the battery during an interval between a pair of times, by multiplying that interval by an average of the corresponding current measurements.

4. The method of claim 2, wherein a total amount of charge extracted is calculated by summing the amounts of charge extracted during each interval.

5. The method of claim 1, wherein the first threshold value comprises a battery voltage of substantially 3.0V.

6. The method of claim 1, further comprising a step of measuring and logging a battery temperature during the first and second constant current discharges.

7. The method of claim 1, wherein the first C-rate is 0.8 C, 0.7 C or 0.3 C, and wherein the second C-rate is 0.1 C or 0.2 C.

8. The method of claim 1, wherein the first and second constant current discharges are performed at substantially a same ambient temperature.

9. The method of claim 8, wherein the ambient temperature is approximately 23-25° C.

10. The method of claim 1, performed using more than two constant current discharges, and by comparing the results across more than one pair of values.

11. The method of claim 1, further comprising a step of providing a log of measured currents, voltages, temperatures and times for each C-rate discharge, plotting the voltage and current as a function of SoC for each C-rate discharge, determining a voltage and current for a specified SoC for each of the C-rate discharges, whereby values of $V_{high\ C\text{-}rate}$, $V_{low\ C\text{-}rate}$, $i_{high\ C\text{-}rate}$ and $i_{low\ C\text{-}rate}$ are used to obtain the DC impedance of the battery at the specified SoC according to the equation:

$$Z_{int}(SoC,T) = (Vbat_{low\ C\text{-}rate} - Vbat_{high\ C\text{-}rate}) / (Iload_{high\ C\text{-}rate} - Iload_{low\ C\text{-}rate}).$$

12. The method of claim 11, wherein calculation of $Z_{int}$ (SoC,T) is repeated for different SoC values.

13. The method of claim 11, therein calculation of $Z_{int}$ (SoC,T) is repeated at different temperatures.

14. The method of claim 11, wherein the DC battery impedance values are stored for later use by a SoC algorithm for correct for variations in the DC battery impedance at different temperatures, voltages and SoC levels.

15. The method of claim 1, further comprising a step of determining a open-circuit voltage VOCV (SoC,T) of the battery using a lower of the C-rate voltages and adding voltage drop due to the DC impedance of the battery according to:

$$V_{OCV}(SoC,T) = V_{Bat}(SoC,T) + Z_{int}(SoC,T) \times I_{load}.$$

16. An apparatus, comprising:
a circuit configured to determine a state of charge of a rechargeable battery comprising:
a discharge circuit configured to discharge the rechargeable battery through a constant current load,
a voltmeter configured to measure a voltage of the rechargeable battery,
an ammeter configured to measure a discharge current of the rechargeable battery,
a temperature sensor configured to measure temperature of the rechargeable battery,
a processor comprising an internal clock and configured to select a desired C-rate for discharging the rechargeable battery through the constant current load, monitor and log the voltage, current and temperature at intervals determined by the internal clock, and determine the state of charge of the rechargeable battery according to the method of claim 1.

17. The apparatus of claim 16, further comprising a disconnect circuit configured to disconnect the rechargeable battery from the constant current load when the voltage reaches a threshold cut-off value.

18. The apparatus of claim 16, further comprising a memory for storing a log of one or more of the measured voltages, currents, temperatures and times when the currents, voltages and temperatures are measured.

* * * * *